United States Patent [19]

Woschetzky

[11] 3,806,914

[45] Apr. 23, 1974

[54] DIGITAL-TO-ANALOG CONVERTER

[75] Inventor: Werner Woschetzky, West Redding, Conn.

[73] Assignee: The Perkin-Elmer Corporation, Norwalk, Conn.

[22] Filed: July 14, 1972

[21] Appl. No.: 271,902

[52] U.S. Cl. . 340/347 DA, 323/43.5 R, 235/150.52

[51] Int. Cl. .............................................. H03k 13/04

[58] Field of Search......... 340/347 DA; 235/150.52; 323/43.5; 336/150

[56] References Cited

UNITED STATES PATENTS

| | | | |
|---|---|---|---|
| 2,849,668 | 8/1958 | Tripp | 340/347 DA |
| 3,603,971 | 9/1971 | Woschetzky et al. | 340/347 DA |
| 3,579,229 | 5/1971 | Tripp | 340/347 DA |
| 3,426,345 | 2/1969 | Kase | 340/347 DA |
| 3,375,513 | 3/1968 | Elbling | 340/347 DA |
| 3,102,258 | 8/1963 | Curry | 340/347 DA |
| 2,970,308 | 1/1961 | Stringfellow et al. | 340/347 DA |
| 2,738,504 | 3/1956 | Gray | 340/347 DA |
| 2,980,899 | 4/1961 | Katz | 340/347 DA |

FOREIGN PATENTS OR APPLICATIONS

| | | | |
|---|---|---|---|
| 832,514 | 4/1960 | Great Britain | 340/347 DA |
| 1,090,239 | 11/1967 | Great Britain | 340/347 DA |

*Primary Examiner*—Thomas J. Sloyan
*Attorney, Agent, or Firm*—Daniel R. Levinson

[57] ABSTRACT

A digital to analog converter includes a transformer having multiple sets of windings wherein each set comprises an ordered plurality of magnetically flux linked windings. Each of the windings of a set corresponds to a digit of a digital number of selected base and each of the sets includes a winding common to the sets and to which an analog input potential is applied. A plurality of digitally control switching means are provided and are coupled to associated sets of windings for coupling portions of the windings of an associated set in series and for providing the sum of the voltages developed therein. The switching means are operated in response to electrical input signals occurring in digital form thereby providing multiple output signals which are directly proportional to the product of the analog input signal and each of the digital signals. In one arrangement, the windings of a set and switching means are intercoupled in a manner for providing a full complement of the output signal thereby enabling the use of inverting amplifiers.

8 Claims, 5 Drawing Figures

DIGITAL-TO-ANALOG CONVERTER

This invention relates to digital to analog converters. The invention relates more particularly to an improved multiplying digital to analog converter.

It is often desirable to provide for the conversion of a function occurring in electrical digital form into a function occurring in analog form. This requirement can arise in synchro and servo control systems, in air and shipborne data computers, and in fire control systems and the like.

While various electromechanical arrangements are known for performing the conversion, a particularly advantageous form of solid state multiplying digital to analog converter comprises a transformer having a set or ordered plurality of magnetically flux linked windings, each of which corresponds to a digit of a selected base. The windings are divided into equal segments by a plurality of winding taps and the number of segments are determined by the base of the digital number being converted. Each segment has a number of turns determined by the power of the base represented by a digit to which the winding corresponds and by an arbitrary number of turns selected to correspond to the unit value of the digital number. An alternating potential is applied to one of the windings and digitally controlled switching means responsive to an electrical signal in digital form is provided for coupling portions of the windings in series and to provide a sum of the voltages developed in the windings. An output thereof thus comprises a relatively accurate analog representation of the digital number. This converter is further advantageous in that the analog output signal represents the product of the mixed analog and digital input signals. A converter of this type is described more fully and claimed in U.S. Pat. No. 3,603,971, which is assigned to the assignee of the present invention and the disclosure of which is incorporated herein by reference.

At times it is desirable to process relatively more complex functions occurring in mixed analog and digital form than is provided by the referred-to-converter. For example, it is often desirable to process resolver information such as sin $(\phi + \theta)$ and cos $(\phi + \theta)$ wherein sin $\phi$ and cos $\phi$ are analog input voltages and sin $\theta$ and cos $\theta$ data are digital inputs. Present systems for accomplishing this function have employed sin-cos potentiometers. These potentiometers however exhibit a degradation in accuracy over their operating life and are limited in reliability because of the utilization of rotating components and brush contacts.

Accordingly, it is an object of this invention to provide an improved device for converting between analog and digital information.

Another object of the invention is to provide an improved form of multiplying digital to analog conversion device.

Another object of the invention is to provide an improved digital to analog converter for processing relatively complex functions which exist in mixed analog and digital electrical form.

A further object of the invention is to provide an improved digital to analog converter for providing a plurality of conversions between mixed digital and analog inputs.

Another object of the invention is to provide a digital to analog converter for processing relatively complex functions while eliminating the use of moving components.

Another more particular object of the invention is to provide an improved digital to analog converter for processing functions of the type $f(\phi + \theta)$.

In accordance with the general features of this invention, a digital to analog converter comprises a transformer having multiple sets of ordered pluralities of magnetically flux linked windings wherein each winding of a set corresponds to a digit of a digital number of a selected base. Each winding is divided into equal segments by a plurality of output taps and the number of segments is determined by the base of the digital number. The number of turns in a segment on each of the windings is determined by the power of the base represented by the digit to which the winding corresponds and by an arbitrary number of turns selected to correspond to the unit value of the digital number. Each of the sets of windings includes a same input winding which is common to the sets and to which an analog input signal is applied. A plurality of digitally controlled switching means is provided. Each switching means is coupled to an associated set of windings. The switching means are responsive to digital electrical control signals applied thereto and which are representative of a number of a selected base. Each of the switching means responsive to a digital input signal, couple portions of the windings of an associated set in series for providing a sum of the voltages developed in portions of the windings.

In accordance with another feature of the invention, the converter is arranged for providing a complemented output signal. The complement is formed by deriving a reverse phase signal from the winding which is common to each of the sets of windings. This reverse phase signal is translated through an associated switching means along with reverse phase voltages derived from each of lower order windings when a digital number having the value 0 is coupled to the input of the switching means. In accordance with a more particular feature of the invention, a low order digit winding includes additional turns in order to provide full complementing in this mode of operation.

These and other objects and features of the invention will be apparent with reference to the following specifications and to the drawings wherein.

Figure 1:
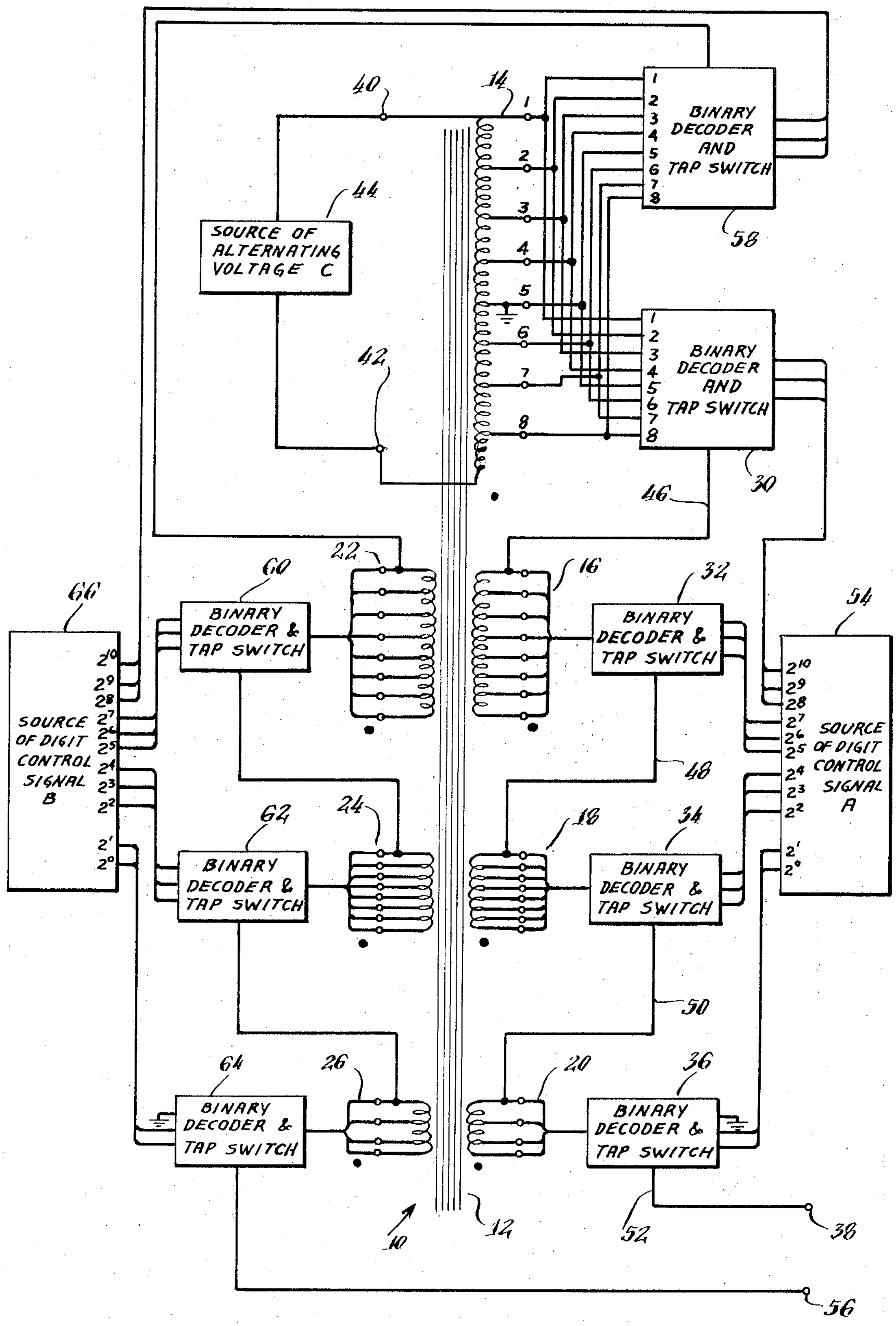
FIG. 1 is a schematic view illustrating the general arrangement of a converting device constructed in accordance with features of this invention.

Referring now to FIG. 1, there is illustrated a transformer referenced generally as 10 having a core body 12, formed of a ferromagnetic material which is preferably toroidally shaped, and upon which is formed multiple sets of flux linked windings. A first set includes the plurality of windings 14, 16, 18, and 20. The winding 14 is common with a second set of windings which also includes the plurality of windings 22, 24, and 26. While two sets of windings are illustrated in FIG. 1, additional sets also having the common winding can be formed on the core. Each of the windings of a set includes a plurality of output taps, as for example taps 1–8 of winding 14, which divides the winding into an equal segment and wherein each segment of a same winding includes a same number of turns.

A first digital decoder and tap switching means is provided and is coupled to the output taps of the associated first set of windings. This decoding and tap switching means includes the switches 30, 32, 34, and 36 which are coupled to the windings 14, 16, 18, and 20 respectively. These switches are adapted for responding to a digital input signal A in electrical form and for intercoupling segments of the different windings of the set in series for providing an output signal at a terminal 38 which is proportionally related to the product of the digital signal and an alternating input signal C. The signal C is applied to the winding 14 via terminals 40 and 42 from a source 44 and excites the transformer. A voltage which is generated across the windings as a result of excitation of the signal C is coupled via output leads 46, 48 and 50 of the switches 30, 32, and 34 respectively to input taps of lower order windings 16, 18 and 20 respectively. An output signal from this first set of windings is coupled to the output terminal 38 from the winding 20 by the switch 36 through the switch output lead 52.

The digital signal A which comprises a multidigit signal existing in electrical form and which is to be converted into an analog representation is derived from a source 54 and is applied to the decoding and tap switching means 30–36. While the digital signal may have any one of various radixes or bases, there is illustrated for purposes of example an eleven digit binary input signal A. The eleven digit signal is applied to each of the decoding and tap switching means 30–36 in a binary-coded octal form. The digital input to the system thus comprises an eleven digit number wherein the first or most significant group of three digits controls the decoding and tap switching means 30, the next least significant group of digits controls the decoding and tap switching means 32, the next least significant group of digits controls the decoding and tap switching means 34 while the remaining two digits controls the decoding and tap switching means 36. The decoding and tap switching means 30–36 in one exemplary embodiment comprises an integrated circuit module such as a Model 3705 MOS Monolithic 8 Channel Multiplex Switch which is manufactured and sold by the Fairchild Camera and Instrument Corporation. The decoding and tap switching means 30–36 are each adapted for accepting the binary-coded octal control input signal and for coupling one of the taps of an associated winding, i.e., 14–20, to the associated output lead of the switch in accordance with the pattern of the input control signal.

Each set of windings is arranged as an ordered plurality of windings wherein a winding is provided for each digit of a digital number. Each of the windings 14 through 20 thus corresponds to a digit of the number. Each of the windings is divided by the plurality of output taps as exemplified by taps 1 through 8 of winding 14, into equal segments and wherein the number of segments is determined by the base of the digital number system. The number of turns in a segment on a winding is determined by the power of the base represented by the digit to which the winding corresponds and by an arbitrary number of turns which is selected to correspond to a unit value of the digital number. The winding 20 corresponds to the lowest order binary-coded octal digit or $8^0$, the winding 18 corresponds to the next higher order octal digit or $8^1$, the winding 16 corresponds to the next higher order octal digit of $8^2$ and the winding 14 corresponds to the next and last highest order digit or $8^3$. In the example illustrated in FIG. 1, the winding 14 includes eight segments, the windings 16 and 18 include eight segments, while the winding 20 for reasons indicated hereinafter is divided into three segments. The number of turns for each segment in the winding 14 comprises 256 turns, the number of turns per segment in the winding 16 comprises 32 turns while the number of turns per segment in the winding 18 comprises 4 turns. The number of turns in the segments of the winding 20 comprises one turn per segment.

In accordance with features of this invention, the second set of windings comprises an ordered plurality of windings arranged in a flux linked relationship on the transformer. Digitally controlled switching means are provided and are coupled to this set of windings. The digital switching means is responsive to a second electrical multidigit digital control signal B for providing a second output at a terminal 56. This second set of windings advantageously utilizes the winding 14 in common with the first set of windings. Since the winding 14 represents the highest ordered digit and has a relatively large number of turns per segment, the sharing of the winding 14 represents a substantial improvement with respect to the size of the transformer required for providing multiple outputs as well as in the cost of fabricating the transformer. Additionally, since a single input analog voltage is applied to the winding 14, and is utilized for exciting both of the multiple sets of windings, the stability of the output signal at terminal 56 with respect to the signal at output terminal 38 is substantially enhanced. In addition, the source 44 is only loaded by a single transformer winding 14.

The digital decoding and tap switching means associated with the second set of windings includes a switch 58 which is coupled to the taps of the winding 14, a switch 60 which is coupled to the winding 22, a switch 62 which is coupled to the winding 24 and a switch 64 which is coupled to the winding 26. Digital control input voltages are applied to each of these switches from a source 66 which provides a multidigit digital signal B in electrical form as described with respect to the source 54. The operation of the decoding and switching means is similar to that described with respect to the first set of windings and an output signal at terminal 56 comprises a digital to analog converted signal which is directly proportional to the product of the digital signal B and the analog signal C. In a typical application, the analog input voltage C from the source 44 comprises the function cos $\phi$ while the signals A and B comprise in digital form the functions sin $\theta$ and cos $\theta$ respectively.

Figure 2:
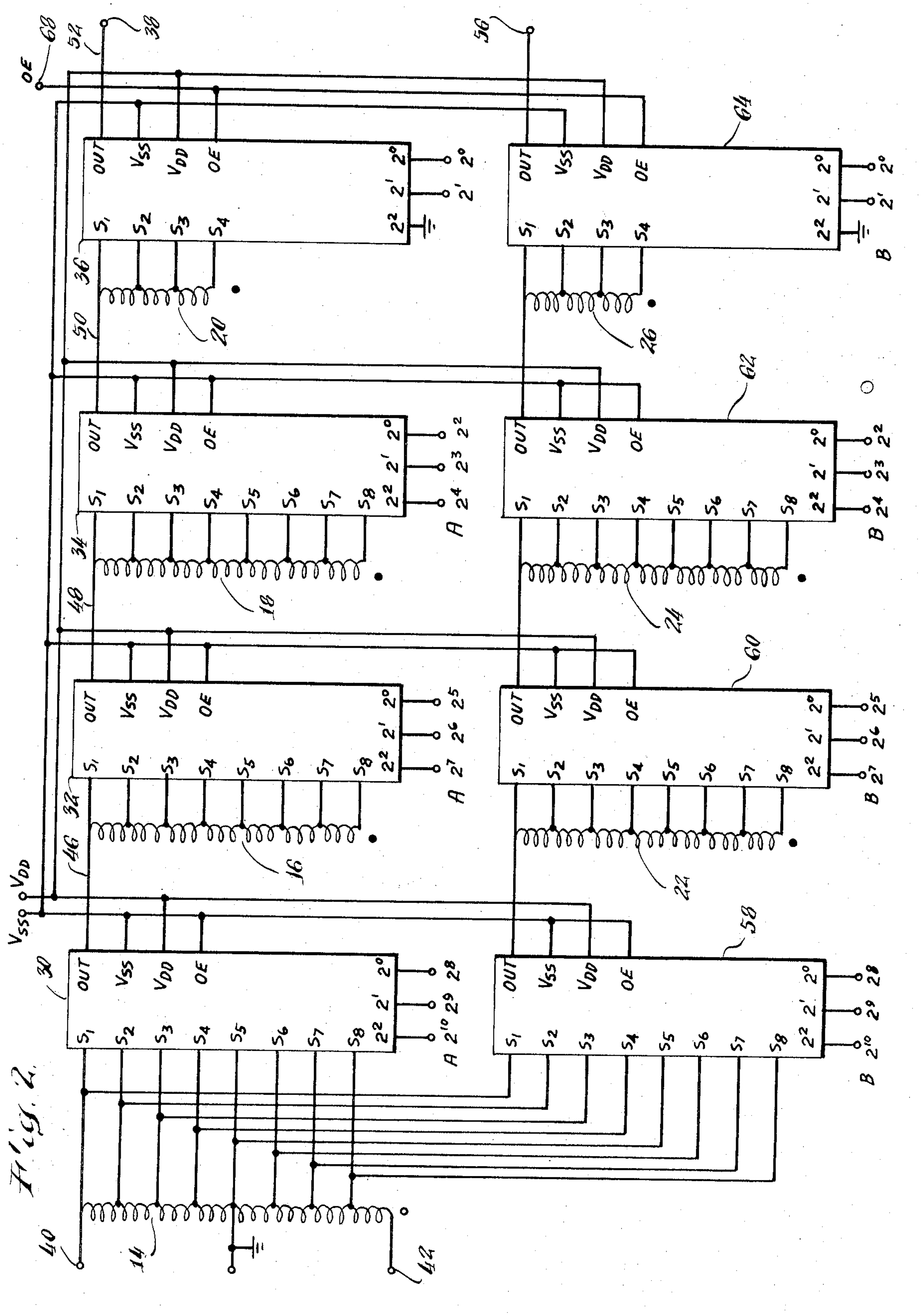
FIG. 2 is a schematic diagram in greater detail illustrating the intercoupling of the transformer windings and digitally responsive switching means of FIG. 1.

Intercoupling between the windings of the sets and the switching means is indicated in further detail in FIG. 2. Each of the digital decoding and tap switching means 30–36 and 58–64 includes a plurality of terminals S1 through S8 which are coupled to taps of associated windings. Each of these digital decoding and tap switching means also includes input terminals for receiving the digital control signals. These terminals are indicated by the binary-coded octal designation in the lower portion of the rectangle for each of these switches. Operating potentials $V_{ss}$ and $V_{dd}$ are applied to each of the decoding and tap switches. In addition, an output enabling terminal is provided for each switch. The switches 30, 32 and 34 as well as the switches 58, 60 and 62 have an enabling potential applied to the output enabling terminal thereby maintaining these switches in an enabled condition. The switches 36 and 64 have coupled thereto an output enable input signal from a terminal 68 thereby providing means for selectively enabling and disabling the outputs of the switches.

In operation, each of the switches are arranged for providing that the application of a binary-coded input signal to the switch will couple a selected one of the switch terminals S1-S8 to the output terminal. The potential at the selected switch input terminal will then be coupled to the switch output terminal. The output terminal of the higher order switches are coupled as an input to a lower order winding. Thus, for example, the occurrence of the binary-coded octal 000 at the binary input terminal of switch 30 results in coupling the input terminal S1 of this switch to its out terminal. The occurrence of the binary-coded number 111 at the binary input terminal results in the coupling of the input terminal S8 of the switch to its output terminal. The various ascending values of the binary-coded input signal to the switch 30 will couple the terminals S1 through S8 to the output terminal. In a similar manner the switches 32–36 and 58–62 receive digital input signals for serially adding the potentials across selected portions of the windings of associated sets.

A higher order digit input terminal of the switches 36 and 64 is coupled to ground potential and, in accordance with the polarity of the digital signaling, establishes a logical 0 at this terminal. Thus, the largest binary-coded octal signal which will be applied to the input terminals of the switches 36 and 64 is 011. This arrangement is provided in view of the fact that the winding 20 comprises three segments which are divided by four taps. The four combinations available for coupling either one of these taps to the output terminal of the switches is provided for by the combinations of the two lower order binary-coded octal digits.

The outputs of the multiplying analog digital converter thus described are generally applied to amplifying devices. An amplifying device tracks an input signal more favorably when it is operating in an inverting mode rather than in a non-inverting mode. Thus, it becomes desirable at times to provide a digital to analog converted signal in complementary form which can take advantage of the tracking of an inverting amplifier and which function at the output of the amplifier is of proper phase.

Figure 3:
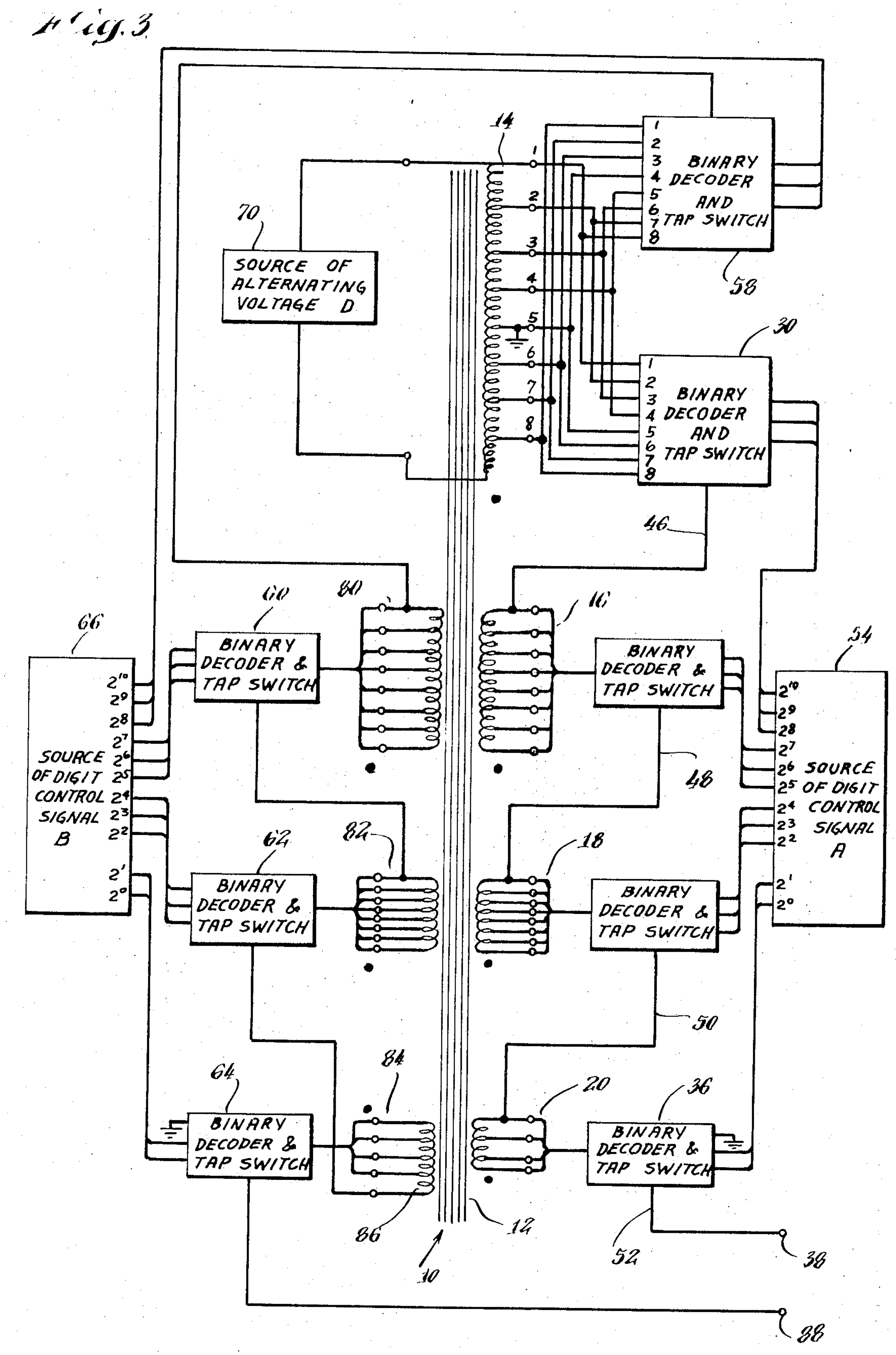
FIG. 3 is a schematic diagram of an alternative arrangement of the converting device constructed in accordance with features of this invention.
Figure 4:
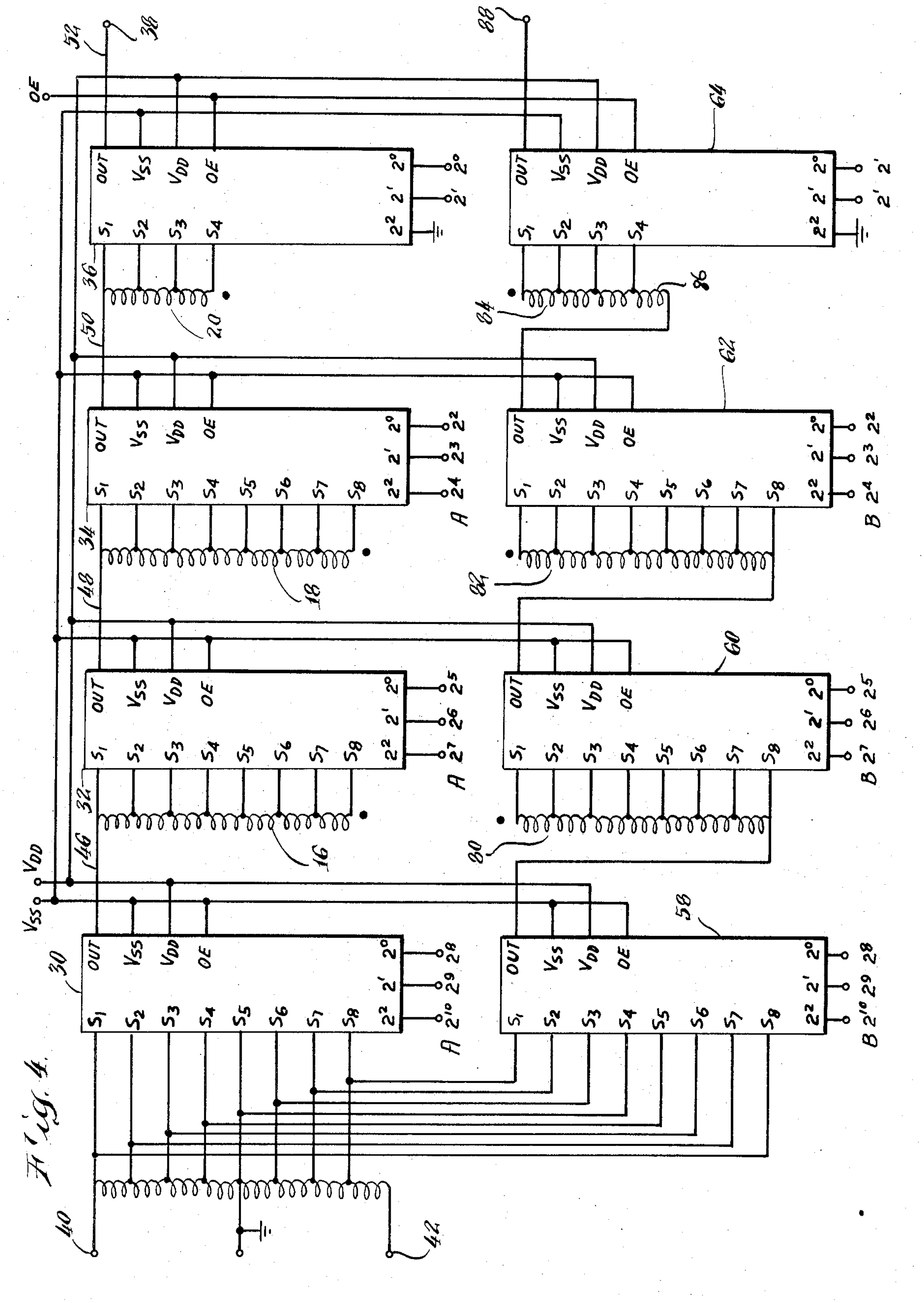
FIG. 4 is a more detailed schematic diagram illustrating the intercoupling of transformer windings and digitally responsive switching means of FIG. 3; and, FIG. 5 is a diagram illustrating a means for combining the output of the converting devices of FIGS. 1 and 2.

In accordance with another feature of the invention, a multiplying digital analog converter is adapted for providing a complementary output signal. The converter for effecting this complementary output is illustrated in FIGS. 3 and 4. Those elements of FIGS. 3 and 4 which perform functions similar to those functions performed by elements of FIGS. 1 and 2 bear the same reference numerals. In general, the set of windings include an ordered plurality of windings 14, 80, 82 and 84 which although similar in arrangement to the windings 14, 22, 24 and 26 of FIG. 1 are reverse coupled to switches 60, 62 and 64 respectively relative to the coupling of the windings of the first set to their associated switches. As the magnitude of the binary-coded octal input to a switch progressively increases, the winding taps of progressively decreasing potential are correspondingly coupled to the switch output terminal. More particularly, the tap 1, of winding 14, for example, while being coupled to input terminal S1 of the switch 30 in FIG. 4 is also coupled to the input terminal S8 of the switch 58. The same reverse coupling applies to the remaining terminals 2–8 of winding 14. In addition to reverse coupling, the winding 84 includes an additional turn 86. By virtue of this reverse coupling and the use of the additional winding 86, a full complement of the product of the digital signal B and the analog signal D is provided at an output terminal 88.

In operation, upon application of the binary-coded octal signal 000 to the switch 58 of FIG. 4, the switch terminal at the relatively high potential tap of winding 14, S1 is coupled to the output terminal of the switch. This is in contrast with the switch 32 wherein a 000 digital input will cause coupling of a lowest potential tap to the output terminal of the switch. The switch 58 with a 000 input will couple approximately 7/8 of the voltage applied between the terminals 40 and 42 to the output terminal of this switch element. Thus, in the presence of an octal 0, a maximum output is derived. The output is equivalent to that provided when an octal 7 is applied as an input to the switch 30. The output of the switch 58 is coupled to the low potential tap of winding 80 which is also an input to the terminal S8 of switch 60. An octal 0 applied to switch 60 will similarly couple the terminal S1 to its output terminal. Because of the reverse coupling of the winding 80, the maximum potential across the winding 80 is also applied to input terminal S1 of the switch 60. Accordingly, a binary-coded octal 0 applied to switch 60 provides an output from the switch which is equivalent to the application of an octal 7 to the switch 32. Switches 62 and 64 of FIG. 4 operate in a similar manner providing for the coupling of a maximum output to their output terminals when binary-coded octal 0 inputs are applied thereto. The additional segment 86 to winding 84 is provided for establishing an output binary 1 when the input to the switch 64 is an octal 0. The turn is employed in order to offset the output in order to generate a full complement.

Various relatively complex functions heretofore provided by sin-cos potentiometers and the like and subject to degradation and accuracy over their life can be performed through the use of the described multiplying digital to analog converter. More particularly, resolver information such as $\sin(\phi + \theta)$ and $\cos(\phi + \theta)$ in which $\sin\phi$ and $\cos\phi$ are analog input voltages and $\sin\theta$ and $\cos\theta$ are digital inputs can be readily provided by the combination of the converters of FIGS. 1 and 3. These functions can be resolved as follows:

$$\sin(\phi + \theta) = \cos\phi \sin\theta + \sin\phi \cos\theta$$

$$\cos(\phi + \theta = \cos\phi \cos\theta - \sin\phi \sin\theta$$

Figure 5:
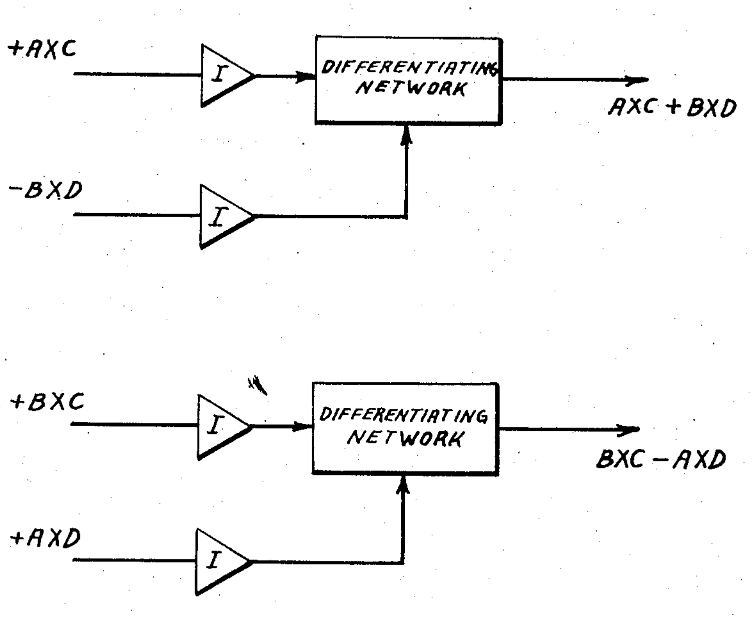

Two of the terms have the same analog multipliers. By employing the described digital to analog converters the analog signal C comprises $\cos\phi$ while the analog signal D comprises $\sin\phi$. The digital input signal A comprises $\sin\theta$ while the digital input signal B comprises $\cos\theta$. FIG. 5 illustrates a network for summing these functions including inverting amplifiers and differentiating or difference-forming networks for providing the desired functions.

There has thus been described an improved multiplying digital to analog converter which advantageously provides two outputs while requiring a single transformer core and the sharing of a same primary winding. In addition, complementing operation is provided thereby enabling advantageous tracking with inverting amplifiers.

While I have described particular embodiments of my invention herein, it will be apparent to those skilled in the art that modifications may be made thereto without departing from the spirit of the invention and the scope of the appended claims.

What is claimed is:

1. An apparatus for combining digital input signals and an analog input signal to form analog outputs comprising:

a transformer having a plurality of sets of windings;

each of said sets having an ordered plurality of magnetically flux-linked windings;

said multiple sets having a winding which is common to each of said sets;

each of said windings in each set corresponding to a digit of a digital number of a selected base;

each of said windings in each set being divided by a plurality of output taps into equal segments, the number of said segments being determined by the base of said digital numbers;

the number of turns in a segment in each of said windings being determined by the power of the base represented by the digit to which the said winding corresponds and by an arbitrary number of turns selected to correspond to the unit value of said digital numbers;

a plurality of separate digital control switches means equal in number to the plurality of sets of windings;

each of said switching means comprising switches for each of the windings in the associated set of windings;

each of said switches associated with each of said sets being responsive to a multi-digit electrical control signal representative of a number of said selected base for coupling portions of each of said windings of the associated set in series to provide a sum of the voltages developed in said portions at each one of a plurality of separate output terminals; and, means for coupling an analog signal to said common winding for exciting said transformer.

2. The apparatus of claim 1 wherein said transformer includes a core of magnetic material and said plurality of sets of windings comprises first and second sets and said first and second sets of windings are wound on said core of magnetic material.

3. An apparatus as claimed in claim 1 wherein said switches in each of said switching means comprises a means for coupling an output tap on each of said windings of an associated set to a low potential winding of a next less significant winding of said associated set and wherein the least significant switch of each of said switching means comprises means for coupling the output taps on the least significant windings of each of said sets to said separate output terminals.

4. The apparatus of claim 3 wherein said input winding which is common to said plurality of sets of windings includes a plurality of taps which are separately coupled to individual switches of each of said plurality of switching means.

5. The apparatus of claim 1 wherein each of the windings of at least one of said sets of windings is reverse coupled to each of the switches of its associated said switching means relative to the coupling of the windings of the other sets and their associated switches for generating the complement of the product of the digital input signal and analog input signal.

6. The apparatus of claim 5 wherein the lowest order winding of said complementing set includes an additional turn relative to the lowest order winding of a non-complementing set.

7. Apparatus for combining two digital input signals and two analog signals comprising;

a first transformer having first and second sets of windings formed thereon;

a second transformer having third and fourth sets of windings formed thereon;

each of said sets of windings having an ordered plurality of magnetically flux-linked windings;

said first and second sets each including a common input winding;

said third and fourth sets each including a common input winding;

means for supplying a first alternating potential analog signal to said common input winding of said first transformer and for supplying a second alternating potential analog signal to said common input winding of said second transformer;

each of said windings of each of said sets corresponding to a digit of a digital number of a selected base;

each of said windings being divided by a plurality of output taps into equal segments, the number of said segments being determined by the base of said digital number;

the number of turns in a segment in each of said winding being determined by the power of the base represented by the digit to which said winding corresponds and by an arbitrary number of turns selected to correspond to the unit value of said digital number;

first and second digitally controlled switching means responsive to first and second multidigit electrical control signals respectively which are representative of first and second numbers of said selected base;

each of said switching means comprising individual switches for coupling portions of each of the windings of said first and second sets of said first transformer in series to provide first and second sums of the voltages developed in said windings;

third and fourth digitally controlled switching means responsive respectively to said first and second multidigit electrical control signals representative of said first and second numbers of said selected base;

each of said third and fourth switching means comprising individual switches for coupling portions of each of said windings of said third and fourth sets of said second transformer in series to provide third and fourth sums of the voltages developed in said windings of said third and fourth sets of said second transformer;

each of the switches of said fourth digitally controlled switching means and each of the windings of said fourth set of said second transformer being intercoupled in reverse order relative to the intercoupling of the switches of the other switching means and the windings of the other sets, thereby providing the complement of the product of said second digital number and said second alternating input signal; and, means for coupling the sum of voltages from each of said sets of windings to a separate output terminal.

8. The apparatus of claim 7 wherein the lowest order winding of said fourth set of said second transformer includes an additional turn relative to the lowest order windings of the other sets of both transformers.

* * * * *